United States Patent

[11] 3,628,017

[72] Inventor Harry Lerner
Lexington, Mass.
[21] Appl. No. 47,610
[22] Filed June 18, 1970
[45] Patented Dec. 14, 1971
[73] Assignee Itek Corporation
Lexington, Mass.
Continuation of application Ser. No. 735,832, June 10, 1968, now abandoned. This application June 18, 1970, Ser. No. 47,610

[54] ULTRAVIOLET LIGHT-SENSITIVE CELL USING A SUBSTANTIALLY CHEMICALLY UNCHANGED SEMICONDUCTOR ELECTRODE IN AN ELECTROLYTE
12 Claims, 2 Drawing Figs.

[52] U.S. Cl. .......... 250/83 CD, 136/89, 204/1, 204/195, 250/83 R, 250/83.3 UV
[51] Int. Cl. .......... G01j 1/42
[50] Field of Search .......... 250/83 CD, 83, 83.3 UV; 136/89; 204/1, 195

[56] References Cited

UNITED STATES PATENTS

| | | | |
|---|---|---|---|
| Re. 19,218 | 6/1934 | Ruben .......... | 136/89 |
| 3,129,148 | 4/1964 | Steinbrecher et al. .......... | 204/1.1 |

*Primary Examiner*—James W. Lawrence
*Assistant Examiner*—Morton J. Frome
*Attorneys*—Homer O. Blair, Robert L. Nathans and W. Gary Goodson

ABSTRACT: This disclosure relates to an ultraviolet light-sensitive cell which is useful for detecting and measuring the intensity of ultraviolet light. The cell comprises an electrolyte, a metal-containing semiconductor electrode and a counter electrode.

HARRY LERNER
INVENTOR.

BY

W. Gary Goodson

ATTORNEY

ULTRAVIOLET LIGHT-SENSITIVE CELL USING A SUBSTANTIALLY CHEMICALLY UNCHANGED SEMICONDUCTOR ELECTRODE IN AN ELECTROLYTE

This application is a continuous-in-part application of Ser. No. 735,832, filed June 10, 1968 now abandoned.

BACKGROUND OF THE INVENTION

1. Field of Invention

This invention has to do with an ultraviolet (UV) light-sensitive cell, and with a method for detecting and measuring the intensity of UV light with the cell.

2. Description of Prior Art

Various UV light detectors have been proposed, as described in the text ULTRAVIOLET RADIATION of Lewis R. Koller, John Wiley & Sons, Inc., New York (1952), particularly at Chapter 8. Among these are radiometric devices including thermopiles, bolometers and radiometers; response of such devices to UV light depends upon a heating effect, but the response is nonselective. Photoelectric devices include phototubes, photovoltaic cells, radiation converters and photoconductive systems; response of such devices and systems is selective but varies considerably. Chemical detectors such as photographic plates have excellent accuracy and sensitivity but are inconvenient to use.

There has been a need, therefore, for UV light detectors having excellent sensitivity over substantially the entire UV range (2,000–4,000 Angstroms) and insensitive to visible light, of relatively low cost and size, simplicity and convenience in use. The present invention is concerned with such a detector to me this need.

SUMMARY OF THE INVENTION

The present invention provides a UV light sensitive detector involving the photoelectrochemical behavior of a semiconductor electrode component thereof. A semiconductor electrode and a counter electrode are each in contact with an electrolyte in a suitable envelope, thus providing a cell. An electrical device responsive to the output of the cell, is associated therewith.

Illumination of the semiconductor electrode with activating light, so-called bandgap light, results in a considerable increase in current flow through the semiconductor. Correspondingly, when the light energy is decreased, the current flow through the semiconductor decreases. The increase or decrease in light energy causes a proportional current flow through the semiconductor.

DESCRIPTION OF THE DRAWINGS

The construction and operation of a detector system of the present invention will become apparent from the description which follows, taken in connection with the accompanying drawings, in which.

DESCRIPTION OF PREFERRED EMBODIMENTS

Figure 1:
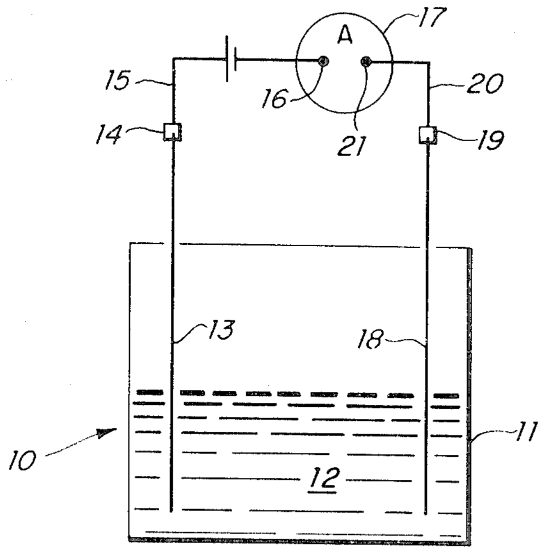
FIG. 1 is a vertical sectional view of a device embodying one form of the invention.

One electrode of the cell comprises N" semiconductor. The preferred semiconductors are the so-called "N" type semiconductors, i.e. semiconductors in which the current carriers are electrons as contrasted with "P" type semiconductors in which the current carriers are holes. The "P" type semiconductors are also useful in this invention as described hereinafter. The semiconductor is usually employed in the form of a layer or film on a suitable substrate. The preferred "N" type semiconductor is a material having a bandgap greater than 3 electron volts and is selected from compounds of metals and of nonmetallic elements of Group VIA of the Periodic Table (given at pp. 56–57 of Lange's HANDBOOK OF CHEMISTRY, 9th Edition, 1956). Suitable semiconductor materials are sensitive only to electromagnetic radiation of wavelength less than about 4,000 A. Such compounds include: oxides, and especially metal oxides, as zinc oxide, titanium dioxide, antimony trioxide, aluminum oxide, indium trioxide, stannic oxide, bismuth oxide ($Bi_2O_3$), tantalum oxide ($Ta_2O_5$); metal sulfides such as zinc sulfide ($ZnS$).

The "N" type semiconductors are easily identified by a simple test procedure. The test material is immersed in a silver nitrate solution and exposed to activating light, e.g. ultraviolet light; if the silver nitrate darkens faster than a control solution of silver nitrate similarly exposed, then the test material is an "N" type semiconductor.

The semiconductor electrode should have a total resistance not greater than about $1\times10^6$ ohms. The preferred semiconductor electrode of stannic oxide, has a thickness of about $10^{-5}$ cm. and a resistivity of about $10^{-3}$ ohm-cm.

The resistance of the film or layer of semiconductor of which one of the electrodes is comprised can be controlled by way of the thickness of the film of the semiconductor. For example, semiconductors of high specific resistance can be operable when used in thin films since it is the resistance of the film of the photoconductor which is the determinant. For practical purposes, the thickness of the film employed should be at least 100m$\mu$ to permit effective absorption of the light. As is generally expected, increase of the thickness of the film will reach the optimum absorption beyond which further increase merely increases the film resistance.

With semiconductors of high resistance, it is preferred to use a substrate which is conductive which compensates to some degree for the high resistance of the semiconductor. Semiconductors of high resistance can be treated to lower the resistance to permit use thereof in the present invention, e.g. by doping with foreign metal ions. Such methods of treatment are known to those skilled in the art. Exemplary doped semiconductors which meet the requirements of the present invention include:

- Antimony-doped stannic oxide
- Chromium (III)-doped titanium dioxide
- Chemically-reduced titanium dioxide (using $CO/CO_2$ or C as reducing agent)
- Doped indium oxide
- Doped zinc oxide
- Doped zinc sulfide
- Doped vanadium oxide The counter or cooperating electrode of the cell is electrochemically dissimilar from the semiconductor electrode. Suitable counterelectrodes include: noble metals such as platinum, palladium, silver, and gold; noble metal in association with a noble metal compound such as Ag/AgCl; carbon, particularly in graphite form; and similar such electrode systems which are generally known in the art.

The semiconductor electrodes and counterelectrodes are chemically inert to the electrolyte and can be used per se but are preferably supported or coated upon a suitable supporting material. Satisfactory supports include glass, plastics such as polystyrene or polymethyl methacrylate and mica. It is preferred that the semiconductor and counter electrodes have maximum surface area per unit of weight.

Electrolytes used in this invention are substantially unreactive with the semiconductor electrode and with the counter electrode. That is, the electrolytes should not decompose the electrodes. Solutions of relatively high conductivity are employed so that the resistance of the solution is at a minimum. Consequently, strong electrolytes are preferred, although it is possible to utilize other electrolytes as long as the resistance of solutions thereof is not too high. For example, a 1 molar solution of a strong electrolyte will generally have a resistivity of from about 2–3 ohm-cm. which is well within the tolerable resistance.

The electrolyte is usually employed at a concentration of from about 1 percent to about 15 percent by weight of solution.

A particularly preferred electrolyte solution is made up of aqueous methanol and hydrochloric acid which gives excellent results as described herein. Further strong acids or bases are suitable. Typical of such acids and bases are sodium and potassium hydroxides, and hydrochloric and sulfuric acids.

Conductivity of the electrolytes can be increased by including therewith relatively small amounts of halides of alkali, alkaline earth and iron-group metals. The quantity of such halides can be varied widely as is well known to those skilled in the art.

As contemplated herein, the electrolyte and electrodes can be within a suitable envelope composed, for example, of glass, enamel, asphalt, synthetic resin and similar such materials commonly used for this purpose. In practice, the envelope requires only one face which transmits light to the semiconductor surface in which case the envelope can include opaque materials as long as provision is made for light transmission to the semiconductor surface. For simplicity, one wall of the envelope can be one of the electrodes, while the other electrode constitutes another wall.

In lieu of a reservoir for the electrolyte solution, the solution can be used to impregnate a sponge, cotton or paper and the like and the solution impregnated material can be contacted with the respective electrodes of the present new cell.

In use, the cell functions by the incidence of ultraviolet light on the semiconductor (anode with "N" type semiconductors) to enhance the oxidation reaction which results in greater current flow. A direct correlation of the increase in current flow and the amount of bandgap light, i.e. photoactivating light, is then made. In the preferred cells of this invention, the dark current, i.e. current prior to light exposure, is usually about 0.01 microamperes whereas the light currents are generally from about 30 to about 40 times greater. After a short period of time, ranging up to about 1 minute or so, a steady reading of the light current is obtained.

For general purpose, and especially in its preferred form, the present invention contemplates the use of a low-voltage cell to provide current flow through the present cell when in use. For example, there may be employed a mercury cell at 0.1 volt, or that order of magnitude.

After the light current reading is obtained it can be compared to a standard set of light current readings which have been obtained with known sources of ultraviolet light, i.e. light of known ultraviolet content, and the corresponding ultraviolet content determined therefrom.

In FIG. 1, a UV-sensitive cell is indicated generally by 10 with glass envelope 11 confining electrolyte 12. Semiconductor electrode 13, such as stannic oxide supported upon quartz, is immersed in the electrolyte and is joined at 14 to lead wire 15 which is connected to terminal 16 of ammeter 17. Counter or cooperating electrode 18, such as platinum supported upon quartz, is immersed in the electrolyte and is joined at 19 to lead wire 20 which, in turn, is connected to terminal 21 of ammeter 17.

As UV light impinges upon electrode 13, a direct correlation of the increase in current flow and the amount of bandgap light is registered on ammeter 17.

As a further embodiment of the present invention, there is provided a cell in which a plurality, preferably two, semiconductor electrodes are provided as a result of which the cell is adapted to measure ultraviolet light in a plurality of regions. For example, cell described in FIG. 1 herein can be modified so that the counterelectrode is suspended in the electrolyte solution and a second wall has a second semiconductor coating which is sensitive to ultraviolet light in a region different from that of the first semiconductor electrode. For example, one semiconductor electrode can be stannic oxide and the other semiconductor can comprise titanium dioxide (on a suitable substrate) with the first electrode being sensitive to UV light of about 3,000 A. and the second to UV light of from about 4,000 A. to about 3,300 A.

If the titanium dioxide is of high resistance, the substrate should be a conductor, e.g. antimony-doped $SnO_2$, for best results.

In the foregoing disclosure, the procedural details relate to the use of "N" type semiconductors which are at present preferred. It is obvious to those skilled in the art that "P" type semiconductors can be employed in the present new cell by simply reversing the polarity thereof.

The present new cells are simple and economical, and, since they can be composed of essentially all glass or all plastic parts, especially the envelope, the size of the cell is limited only by the size of the component parts. In other words, the size of the cell is limited only by the ability to manufacture the components, as contrasted with commercially available ultraviolet light detectors which do have serious size-limitations, e.g. the vacuum photodiodes which are somewhat bulky and the required associated electronic equipment is also bulky and expensive. The present new cells are at least as efficient as vacuum photodiodes, and are obviously more economical and easier to employ.

Further advantage of the present new cells is the wide range of ultraviolet light which can be detected by virtue of selection of semiconductors which absorb over a substantial range of ultraviolet light. Thus, by merely varying the semiconductor electrode, the present new cells can be used for measurement of ultraviolet light of any specific wavelength depending on selection of the semiconductor, and the same cell can be employed by merely changing the semiconductor electrode.

The invention is further illustrated by the following examples.

EXAMPLE 1

With a cell such as shown by FIG. 1, a stannic oxide anode, a platinum counter electrode and a 10 percent NaOH solution containing about 5 percent by weight KCl, a potential of 1 volt provided a dark current of approximately 0.1 microamperes with a light intensity (wavelength=254m$\mu$) of about 300 ergs.cm.$^{-2}$. sec$^{-1}$, the current was increased to approximately 2 microamperes.

Figure 2:
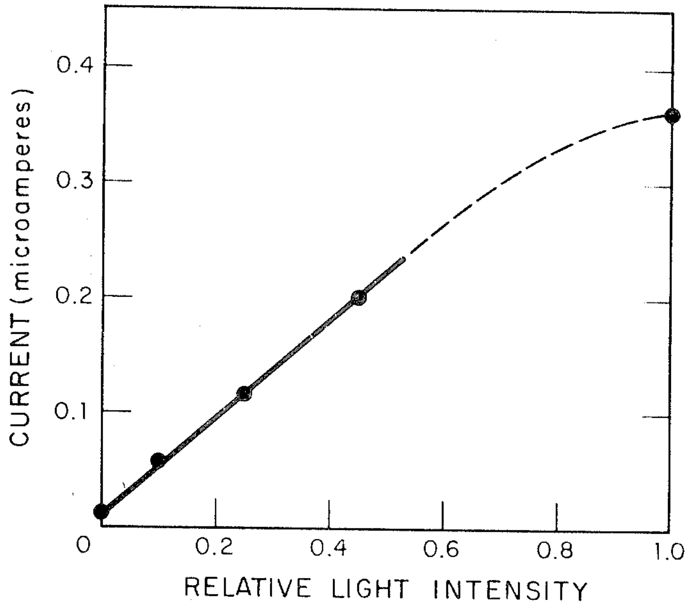
FIG. 2 is a graph illustrating the relationship of current (ordinate) and relative light intensity (abscissa) obtained with a device such as shown by FIG. 1.

This relationship is indicated graphically by FIG. 2 wherein current in microamperes (ordinate) is related to relative light sensitivity (abscissa). This relationship is derived from the values set forth in table I below.

TABLE I

| Relative Light Intensity | Current in Microamperes |
|---|---|
| 0 | 0.01 |
| 0.1 | 0.0575 |
| 0.25 | 0.115 |
| 0.45 | 0.20 |
| 1.0 | 0.36 |

EXAMPLE 2

Again with a cell such as described in example 1 but with an electrolyte comprising 50 percent by volume of methyl alcohol and 50 percent by volume of 2 normal aqueous hydrochloric acid, the sensitivity of the cell at 2,537 A. was increased from 0.0015 to 0.03 microamperes/microwatt. This sensitivity is equal to the sensitivity of a standard vacuum photodiode for use in this energy region.

In the preceding examples, the stannic oxide employed contained a small amount of antimony which acts as an impurity donor and considerably increases the conductivity of the semiconductor. Then, transparent films of the semiconductor on glass (commercially known as NESA glass), were used to prepare the semiconductor electrodes.

The cell employed to provide a potential of 1 volt was a mercury cell (E=1.35 v.) with a variable resistor to get optimum responses.

The effect obtained with the methanol hydrochloric acid electrolyte is explainable in terms of enhancement of the oxidation via the relatively large change in the hole concentration which results from the activating radiation. In other words, the methanol is oxidized at the anode via charge transfer to the valence band and apparently appreciably affects the current flow as would be expected of any compound which readily oxidizes at the anode under the specified conditions via the valence band, i.e. any compound which oxidizes by releasing electrons to the holes of the semiconductor should enhance the current flow.

What is claimed is:

1. An ultraviolet light-sensitive cell comprising an envelope surrounding an electrolyte, an electrode comprising a layer of a semiconductor sensitive only to electromagnetic radiation having a wavelength less than about 4,000 A. and having a maximum resistance of about $10^6$ ohms and a counter electrode, the electrolyte being substantially incapable of causing permanent chemical change of the semiconductor electrode, and wherein the semiconductor electrode remains substantially chemically unchanged during operation of the cell and the cell being such that increased electrical current is generated in the cell as the semiconductor electrode is exposed to increasing intensities of ultraviolet radiation.

2. An ultraviolet light-sensitive cell comprising an envelope surrounding an electrolyte, an electrode comprising a layer of a semiconductor having a maximum resistance of about $10^6$ ohms and a counterelectrode, the semiconductor comprises a compound of a metal and a nonmetallic element of Group VIA of the Periodic Table and additionally comprising a means for passing a direct current between the counter electrode and the semiconductor electrode and the cell being such that increased electrical current is generated in the cell as the semiconductor electrode is exposed to increasing intensities of ultraviolet radiation.

3. The cell of claim 2 wherein the semiconductor comprises a metal oxide or metal sulfide.

4. The cell of claim 3 wherein the metal oxide is stannic oxide.

5. The cell of claim 3 wherein the metal oxide is titanium dioxide.

6. The cell of claim 3 wherein the semiconductor is transparent.

7. The cell of claim 1 wherein the counterelectrode comprises a noble metal and additionally comprises means for providing current through the light-sensitive cell.

8. In an ultraviolet light-sensitive system, a cell as defined by claim 1 and an electrical device responsive to the output of said cell.

9. The method for detecting and measuring the intensity of ultraviolet light comprising illuminating a semiconductor material in contact with an electrolyte having a counterelectrode in electrical contact therewith, the electrolyte being substantially incapable of causing permanent chemical change of the semiconductor electrode and wherein the semiconductor electrode remains substantially chemically unchanged during operation of the cell, and measuring the current between the said semiconductor material and said counterelectrode and the cell being such that increased electrical current is generated in the cell as the semiconductor electrode is exposed to increasing intensities of ultraviolet radiation.

10. The method as in claim 9 including the step of passing a current through the semiconductor material-electrolyte counterelectrode path, and measuring the change in current upon illumination of the semiconductor material with ultraviolet light.

11. Method as in claim 9 wherein the semiconductor is stannic oxide or titanium dioxide.

12. Method as in claim 9 wherein the semiconductor is stannic oxide and titanium dioxide.

* * * * *